United States Patent
Cheng

(10) Patent No.: US 6,792,056 B1
(45) Date of Patent: Sep. 14, 2004

(54) CANCELLATION CIRCUIT THAT SUPPRESSES ELECTROMAGNETIC INTERFERENCE IN A HIGH SPEED CIRCUIT USING A FUNCTION GENERATOR

(75) Inventor: Yu-Chiang Cheng, Taipei (TW)

(73) Assignee: Mitac International Corp., Hsin-Chu Hsien (TW)

( * ) Notice: Subject to any disclaimer, the term of this patent is extended or adjusted under 35 U.S.C. 154(b) by 731 days.

(21) Appl. No.: 09/698,098

(22) Filed: Oct. 30, 2000

(30) Foreign Application Priority Data

Nov. 30, 1999 (TW) .................................. 88120831 A

(51) Int. Cl.⁷ .................. H04L 25/08; H01L 27/10; H01L 29/40; H01L 23/52
(52) U.S. Cl. .................. 375/346; 257/207; 257/664; 257/691
(58) Field of Search .................. 375/346; 324/225; 333/12; 257/207

(56) References Cited

U.S. PATENT DOCUMENTS

| | | | | |
|---|---|---|---|---|
| 5,909,144 A | * | 6/1999 | Puckette et al. ............ | 327/551 |
| 6,118,405 A | * | 9/2000 | Mckinnon et al. ... | 343/700 MS |
| 6,211,671 B1 | * | 4/2001 | Shattil ........................ | 324/225 |
| 6,215,454 B1 | * | 4/2001 | Tran ........................... | 343/841 |
| 6,344,667 B1 | * | 2/2002 | Miyagi ....................... | 257/207 |
| 6,429,749 B1 | * | 8/2002 | Cheng ........................ | 333/12 |

* cited by examiner

Primary Examiner—Stephen Chin
Assistant Examiner—Cicely Ware
(74) Attorney, Agent, or Firm—Rabin & Berdo, P.C.

(57) ABSTRACT

The specification discloses a cancellation circuit that suppresses electromagnetic interference in a high speed circuit using a function generator so as to utilize differential signals to cancel the magnetic field and to couple with the electric field without affecting the quality of signals. The differential signals are generated from a clock pin of the function generator, which is phase shifted by a phase shifter and passes through a microstrip antenna or a stripline antenna so as to emit electromagnetic waves with inversed phases, canceling the originally existent electromagnetic waves.

22 Claims, 3 Drawing Sheets

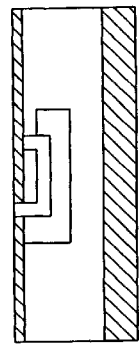
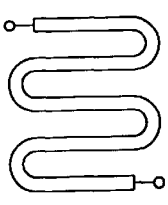
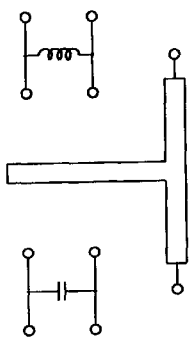
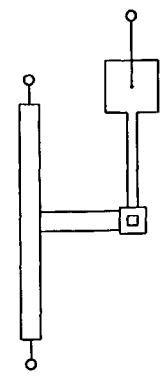
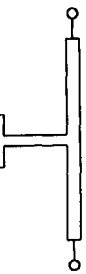
Fig. 3A PRIOR ART
Fig. 3B PRIOR ART
Fig. 3C PRIOR ART
Fig. 3D PRIOR ART
Fig. 3E PRIOR ART
Fig. 3F PRIOR ART
Fig. 3G PRIOR ART
Fig. 3H PRIOR ART

CANCELLATION CIRCUIT THAT SUPPRESSES ELECTROMAGNETIC INTERFERENCE IN A HIGH SPEED CIRCUIT USING A FUNCTION GENERATOR

BACKGROUND OF THE INVENTION

1. Field of Invention

The present invention relates to a cancellation circuit that suppresses electromagnetic interference in a high speed circuit and, more particularly, to a cancellation circuit that cancels the magnetic field and couples with the electric field using a function generator.

2. Related Art

To increase the electromagnetic compatibility (EMC) of electronic products, one has to take account of the circuits for the power, signal lines, analogue signals, digital signals, and so forth when designing products. One crucial thing is the filter circuit, including the decoupling capacitor, the filter capacitor, the bypass capacitor, etc. Since the clock rate on the PC board is increasing (from 33 MHz to 133 MHz), normal filters for signals (including RC filters and LC filters) cannot achieve the object of canceling electromagnetic interference in a high speed circuit under the consideration of the possibility of affecting the signal quality.

In observation of the fact that the above-mentioned filters will seriously affect the signal quality of a high speed circuit, it is a feasible way to use differential signals to cancel electromagnetic interference in a high speed circuit. However, most current high speed circuit signals are single-ended signals, and their electromagnetic interference cannot cancel with that of the differential signals.

When a PCB is used in high speed digital circuit processing, it needs to process narrow pulses with rapid rising and falling times and avoid incorrect actions due to power damages. Therefore, a cancellation circuit for solving electromagnetic interference in a high speed circuit becomes very important.

SUMMARY OF THE INVENTION

Differential signals that are used in the cancellation circuit of the invention are generated from a clock pin of a function generator, which is phase shifted by a phase shifter and passes through a microstrip antenna or a stripline antenna so as to emit electromagnetic waves with inversed or shifted phases, canceling the originally existent electromagnetic waves.

BRIEF DESCRIPTION OF THE DRAWINGS

The present invention will become more fully understood from the detailed description given hereinbelow illustration only, and thus are not limitative of the present invention, and wherein:

FIGS. 3A through 3H show conventional phase shifter models.

DETAILED DESCRIPTION OF THE INVENTION

According to the current PC architecture, most IC pulses are provided by a function generator which is usually an oscillator that generates radio frequency signals (above 100 kHz). It generates necessary signals such as the outputs, frequencies and modulation frequencies. These pulses trace through the whole PCB through the PCB circuits. The magnetic and electric fields produced due to running current pulses permeate the whole PC, producing plane waves in the far field. Therefore, the invention provides a cancellation circuit that suppresses electromagnetic interference in a high speed circuit using a function generator.

Figure 1:
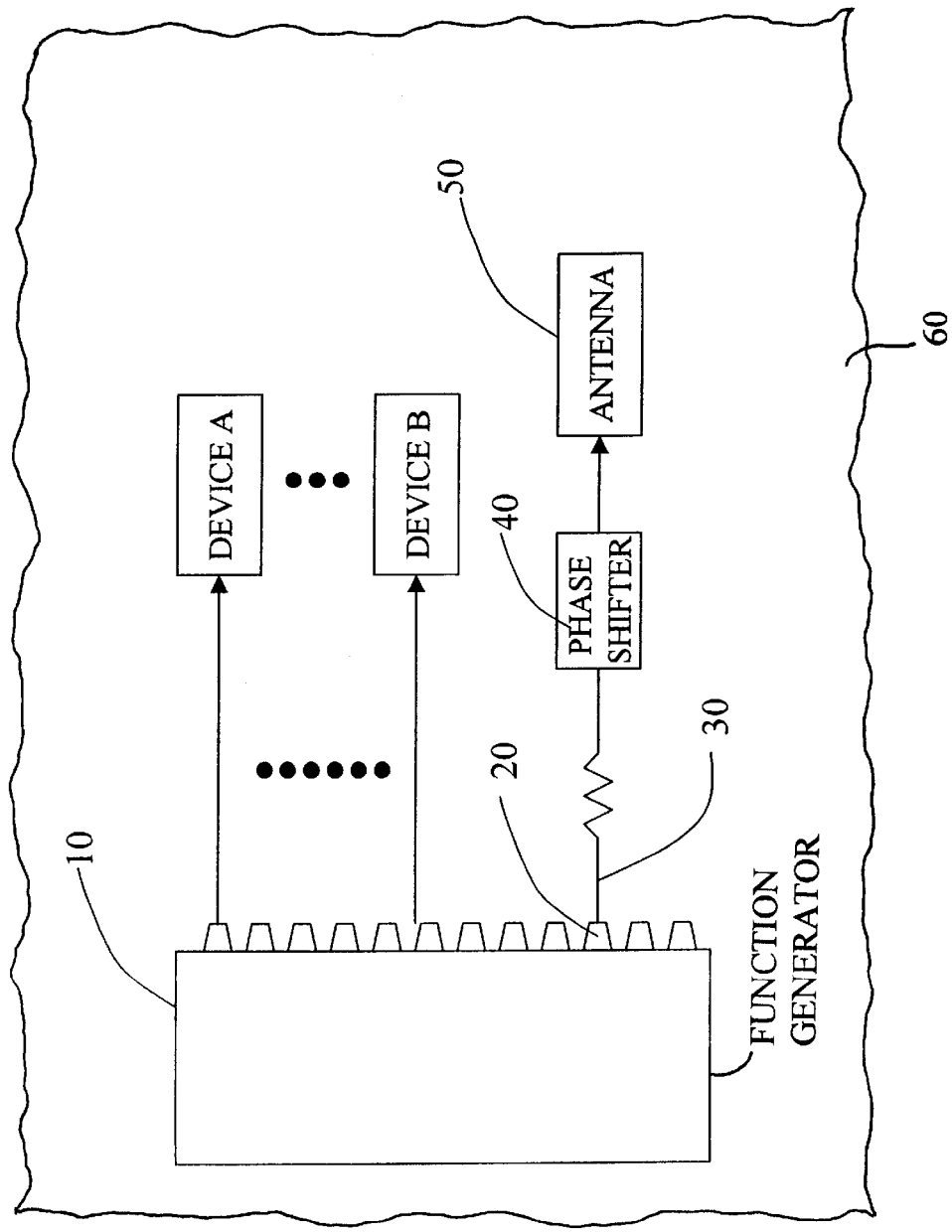
FIG. 1 is a schematic view of a cancellation circuit that suppresses electromagnetic interference in a high speed circuit according to an embodiment of the invention.

FIG. 1 is a schematic view of a cancellation circuit that suppresses electromagnetic interference in a high speed circuit on a PCB 60 according to an embodiment of the invention. An ineffective or excess clock pin 20 of a function generator 10 connects to a signal line 30 that goes through a phase shifter 40 after which the signal is phase shifted to become a dummy signal, forming a differential signal circuit. An antenna 50 is employed to emit electromagnetic waves with inversed or shifted phases. The antenna 50 can be a microstrip antenna or a stripline antenna. This achieves the object of canceling the originally existent electromagnetic waves.

The usual microstrip antenna 50 is made by using the front end open circuit of the microstrip antenna as the emitting antenna. The lower portion of the microstrip circuit relative to the dielectric substrate is a conductor. When the conducting area in the lower portion of the substrate is much greater than the microstrip circuit width W, this conductor has effectively the same effects of an infinitely extending conductor. If there is a current running through the microstrip circuit, then, aside from the lower conductor, it is equivalent to a microstrip circuit with a current running in the opposite direction. Therefore, if an imaginary current is running through the microstrip circuit, it can be considered as equivalent to a Lecher transmission circuit, i.e., a parallel circuit.

Figure 2A:
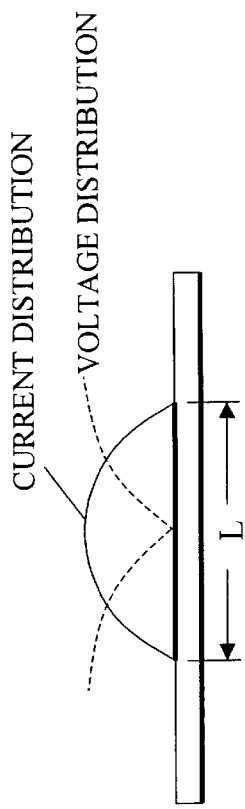
FIG. 2A is a schematic view of the standing waves on a microstrip circuit employed in the embodiment of the invention.

To investigate the dipole antenna from the standing wave distribution on the Lecher circuit, the standing wave distribution on the microstrip circuit when both of its ends are open is shown in FIG. 2A.

Figure 2B:
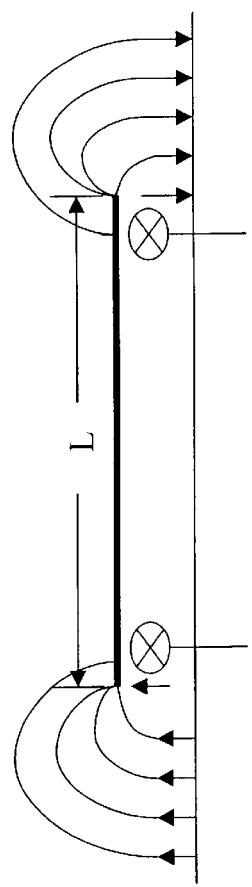
FIG. 2B is a schematic view showing the end radiation of the microstrip circuit employed in the embodiment of the invention.

The resonance length of the microstrip antenna is mainly determined from the length of the circuit, the dependence on the circuit width is negligible. Nevertheless, one has to take account of the radiation from this part in the actions of the antenna. FIG. 2B is a schematic view showing the end radiation of the microstrip circuit employed in the embodiment of the invention. Although the electromagnetic field is not so bad in the closed microstrip, the electric field at the antenna ends will spread out. That is, by making the magnetic fluxes opposite in direction, the radiated electric field will cancel with the originally existing electric field.

Figure 2C:
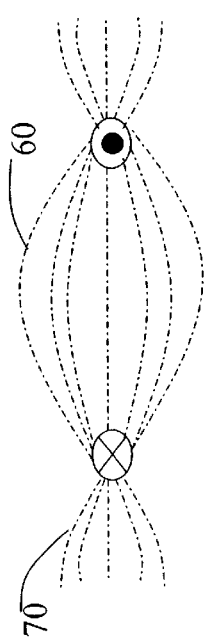
FIG. 2C is a schematic view of electromagnetic field cancellation and stray fringing field strength according to the embodiment of the invention.

Through a microstrip antenna 50 or a stripline antenna 50 to emit electromagnetic waves with inversed phases, the phase difference can range from 90° to 180°, depending upon the phase shifter 40 design. This differential signal can cancel the magnetic field and couples with the electric field according to Ampere's Law (FIG. 2C) without influencing the signal quality. In the drawing, ⊕ means the current direction (into the paper) of the wire 30 and ⊙ is the current direction (out of the paper) flowing through other pins of the function generator. Therefore, in the near field, most of the electromagnetic field 60 is cancelled. There is only very little stray fringing field 70 traveling into plane waves in the far field. This greatly reduces electromagnetic radiation.

The phase shifter employed in the present invention can be selected from one of the conventional phase shifters shown in FIGS. 3*a* to 3*h*. FIG. 3*a* depicts a straight delay line type, FIG. 3B is a meander-line delay line type, FIG. 3*c* is a T-junction phase type, FIG. 3*d* is a series phase type, FIG. 3*e* is a series PIN diode phase type, FIG. 3*f* is a shunt phase type, FIG. 3*g* is a shunt PIN diode phase type and FIG. 3*h* is a ferroelectric phase type.

While the present invention has been disclosed in reference to the preferred embodiments, it shall be understood by those skilled in the art that various changes, modifications and substitutions may be incorporated into such embodiments without departing from the spirit of the invention as defined by the claims appearing hereinafter.

What is claimed is:

1. A cancellation circuit that suppresses electromagnetic interference in a high speed circuit connected to a function generator, the high speed circuit and function generator being carried by a printed circuit board, said cancellation circuit comprising:

a signal line on the printed circuit board and connected to a clock pin of the function generator;

a phase shifter on the printed circuit board, which shifts the phase of the signal line;

a differential signal circuit, which is a dummy signal circuit on the printed circuit board after the phase shifter shifts the phase; and an antenna on the printed circuit board, which emits electromagnetic waves with inversed phases using the differential signal circuit so as to cancel with the magnetic field and to couple with the electric field.

2. The cancellation circuit of claim 1, wherein the phase shifter is a straight delay line type.

3. The cancellation circuit of claim 1, wherein the phase shifter is a meander-line delay line type.

4. The cancellation circuit of claim 1, wherein the phase shifter is a T-junction phase type.

5. The cancellation circuit of claim 1, wherein the phase shifter is a series phase type.

6. The cancellation circuit of claim 1, wherein the phase shifter is a series PIN diode phase type.

7. The cancellation circuit of claim 1, wherein the phase shifter is a shunt phase type.

8. The cancellation circuit of claim 1, wherein the phase shifter is a shunt PIN diode phase type.

9. The cancellation circuit of claim 1, wherein the phase shifter is a ferroelectric phase type.

10. The cancellation circuit of claim 1, wherein the antenna can be a microstrip antenna.

11. The cancellation circuit of claim 1, wherein the antenna can be a stripline antenna.

12. A cancellation circuit that suppresses electromagnetic interference in a high speed circuit on a printed circuit board characterized in that:

under the premise of not affecting signal quality a clock pin of a function generator on the printed circuit board connects to a signal line that passes through a phase shifter on the printed circuit board to generate differential signals, which signals then pass through a microstrip antenna or a stripline antenna to emit electromagnetic waves with inversed phases so as to cancel with originally existing electromagnetic waves.

13. The cancellation circuit of claim 12, wherein the phase shifter is a straight delay line type.

14. The cancellation circuit of claim 12, wherein the phase shifter is a meander-line delay line type.

15. The cancellation circuit of claim 12, wherein the phase shifter is a T-junction phase type.

16. The cancellation circuit of claim 12, wherein the phase shifter is a series phase type.

17. The cancellation circuit of claim 12, wherein the phase shifter is a series PIN diode phase type.

18. The cancellation circuit of claim 12, wherein the phase shifter is a shunt phase type.

19. The cancellation circuit of claim 12, wherein the phase shifter is a shunt PIN diode phase type.

20. The cancellation circuit of claim 12, wherein the phase shifter is a ferroelectric phase type.

21. A cancellation circuit for suppressing electromagnetic interference in a high speed circuit on a printed circuit board, the high speed circuit being connected to a function generator on the printed circuit board, said cancellation circuit comprising:

an antenna on the printed circuit board; and a phase shifter on the printed circuit board, the phase shifter being connected between the antenna and a pin of the function generator that is not connected to the high speed circuit, wherein the antenna is a stripline or microstripline antenna.

22. The cancellation circuit of claim 21, wherein the phase shifter is selected from the group consisting of a straight delay line phase shifter, a meandering delay line phase shifter, a T-junction phase shifter, a series phase shifter, a PIN diode phase shifter, a shunt phase shifter, a shunt PIN diode phase shifter, and a ferroelectric phase shifter.

* * * * *